United States Patent
Kim et al.

(10) Patent No.: US 8,542,044 B2
(45) Date of Patent: Sep. 24, 2013

(54) SEMICONDUCTOR INTEGRATED CIRCUIT AND METHOD FOR DRIVING THE SAME

(75) Inventors: Yong-Ju Kim, Gyeonggi-do (KR); Dae-Han Kwon, Gyeonggi-do (KR); Hae-Rang Choi, Gyeonggi-do (KR); Jae-Min Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 90 days.

(21) Appl. No.: 13/334,241

(22) Filed: Dec. 22, 2011

(65) Prior Publication Data

US 2013/0099838 A1    Apr. 25, 2013

(30) Foreign Application Priority Data

Oct. 20, 2011    (KR) .................. 10-2011-0107587

(51) Int. Cl.
*H03L 7/06*    (2006.01)
(52) U.S. Cl.
USPC .......................................... 327/158; 327/147
(58) Field of Classification Search
USPC ................................. 327/147, 158
See application file for complete search history.

(56) References Cited

U.S. PATENT DOCUMENTS

| | | | | |
|---|---|---|---|---|
| 7,271,634 | B1 * | 9/2007 | Daga et al. ..................... | 327/149 |
| 2009/0015338 | A1 * | 1/2009 | Frey ................................ | 331/16 |
| 2012/0306551 | A1 * | 12/2012 | Moon et al. ..................... | 327/149 |
| 2013/0082754 | A1 * | 4/2013 | Chern et al. ..................... | 327/157 |
| 2013/0099838 | A1 * | 4/2013 | Kim et al. ....................... | 327/158 |
| 2013/0106475 | A1 * | 5/2013 | Lin et al. ........................ | 327/148 |

FOREIGN PATENT DOCUMENTS

| | | |
|---|---|---|
| KR | 100930416 | 12/2009 |
| KR | 100968460 | 7/2010 |
| KR | 101022674 | 3/2011 |
| KR | 101040243 | 6/2011 |

* cited by examiner

*Primary Examiner* — Adam Houston
(74) *Attorney, Agent, or Firm* — IP & T Group LLP

(57) ABSTRACT

A semiconductor integrated circuit includes: a delay locked loop (DLL) configured to generate a DLL clock signal by delaying a source clock signal by a first delay time for obtaining a lock, wherein an update period of the DLL is controlled in response to an update period control signal after locking is completed; and an update period controller configured to generate the update period control signal based on a second delay time occurring in a loop path of the DLL in response to the source clock signal and a plurality of control signals provided from the DLL.

20 Claims, 5 Drawing Sheets

US 8,542,044 B2

SEMICONDUCTOR INTEGRATED CIRCUIT AND METHOD FOR DRIVING THE SAME

CROSS-REFERENCE TO RELATED APPLICATIONS

The present application claims priority of Korean Patent Application No. 10-2011-0107587, filed on Oct. 20, 2011, which is incorporated herein by reference in its entirety.

BACKGROUND

1. Field

Exemplary embodiments of the present invention relate to semiconductor design technology, and more particularly, to a semiconductor integrated circuit including a delay locked loop (DLL) and a method for driving the same.

2. Description of the Related Art

In general, a semiconductor integrated circuit such as DDR SDRAM (Double Data Rate Synchronous DRAM) includes a DLL configured to equalize the phases of an internal clock signal and an external clock, in order to compensate for time delay caused by an internal circuit when the external clock signal inputted from outside is used inside. More specifically, the DLL receives an external clock signal, compensates for delay components in an actual clock path and data path, and applies negative delay in advance such that data outputted from the semiconductor integrated circuit may be synchronized with the external clock signal.

FIG. 1 is a block configuration diagram of a conventional semiconductor integrated circuit.

Referring to FIG. 1, the conventional semiconductor integrated circuit 100 includes an input buffer 110, a DLL 120, and an output driver 130. The input buffer 110 is configured to generate an internal clock signal ICLK corresponding to an external clock signal ECLK inputted through a first pad PAD1. The DLL 120 is configured to generate a DLL clock signal DLLCLK corresponding to the internal clock signal ICLK. The output driver 130 is configured to output data SYNC_DATA synchronized with the DLL clock signal DLLCLK to a second pad PAD2.

FIG. 2 is an internal configuration diagram of the DLL 120 illustrated in FIG. 1.

Referring to FIG. 2, the DLL 120 includes a delay line 121, a replica delay 123, a phase comparator 125, and a control signal generator 127. The delay line 121 is configured to delay the internal clock signal ICLK by a delay time for locking the clock signal in response to a delay control signal CTRL_DELY and output the DLL clock signal DLLCLK. The replica delay 123 is configured to delay the DLL clock signal DLLCLK by a delay time D3 equal to an actual delay through a clock path and data path and output a feedback clock signal FBCLK. The phase comparator 125 is configured to compare the phases of the internal clock signal ICLK and the feedback clock signal FBCLK to output a comparison signal UP/DN. The control signal generator 127 is configured to generate the delay control signal CTRL_DELY in response to the comparison signal UP/DN.

Here, the delay time D3 equal to the actual delay through the clock path and data path is typically referred to as a replica delay time. The modeled delay time D3 is defined as the sum of a delay time D1 equal to an actual delay through a path until the internal clock signal ICLK is generated from the first pad PAD1 receiving the external clock signal ECLK and a delay time D2 equal to an actual delay through a path until the data SYNC_DATA synchronized with the DLL clock signal DLLCLK is outputted to the second pad PAD2 (D3=D1+D2).

Hereinafter, an operation of the semiconductor integrated circuit 100 configured in such a manner will be described.

During initial driving, when the external clock signal ECLK is buffered through the input buffer unit 110 and transmitted as the internal clock signal ICLK to the delay line 121, the delay line 121 bypasses the internal clock signal ICLK.

Subsequently, the replica delay 123 delays the DLL clock signal DLLCLK outputted from the delay line 121 by the replica delay time D3 and outputs the delayed DLL clock signal to the phase comparator 125.

The phase comparator 125 compares the phase of the internal clock signal ICLK outputted form the input buffer unit 110 with that of the feedback clock signal FBCLK outputted from the replica delay 123. The control signal generator 127 generates the delay control signal CTRL_DELY in response to the comparison signal UP/DN outputted from the phase comparator 125 and outputs the delay control signal CTRL_DELY to the delay line 121.

Accordingly, the delay line 121 delays the internal clock signal ICLK by a desired delay time in response to the delay control signal CTRL_DELY and outputs the DLL clock signal DLLCLK.

When the above-described series of operations are repeated and the phases of the internal clock signal ICLK and the feedback clock signal FBCLK are synchronized with each other as the comparison result of the phase comparator 125, a first delay time of the delay line 121 is locked. This is shown in FIG. 3.

Referring to FIG. 3, it can be seen that the internal clock signal ICLK and the feedback clock signal FBCLK are synchronized with each other. At this time, the DLL clock signal DLLCLK is delayed by the first delay time (N*tCK−D3) for locking, compared with the internal clock signal ICLK.

Meanwhile, after the first delay time (N*tCK−D3) for obtaining a lock the delay line 121 is decided, that is, after a tracking process is completed, an update process is performed at each desired period. The update process is performed to compensate for a jitter which may occur in the DLL clock signal DLLCLK due to noise or the like. The update process is performed by repeating the above-described tracking process.

The semiconductor integrated circuit 100 may exhibit stable operation performance because output data is synchronized with the external clock signal ECLK.

However, the semiconductor integrated circuit 100 configured in such a manner also has the following features.

The DLL 120 included in the semiconductor integrated circuit 100 may perform the update process using a desired update period, after the tracking process is completed. Here, the DLL 120 may not generate a stable DLL clock signal DLLCLK for each different operation environment. For example, in a low-VDD and high frequency environment, the update period may be faster than the delay time occurring in the loop path of the DLL 120, which includes the delay line 121, the replica delay 123, the phase comparator 125, and the control signal generator 127. Accordingly, a jitter occurs in the DLL clock signal DLLCLK. Furthermore, in a high-VDD and low-frequency environment, the update period may be slower than the delay time occurring in the loop path of the DLL 120. Accordingly, tracking speed may not be optimized during the update process. According to an example, the delay time occurring in the loop path of the DLL 120 changes according to an operation frequency or PVT (process, voltage, and temperature) condition. Here, optimizing the update period of the DLL 120 is useful.

SUMMARY

An embodiment of the present invention is directed to a semiconductor integrated circuit in which the update period of a DLL is optimized/appropriately adjusted regardless of an operation environment and a method for driving the same.

Another embodiment of the present invention is directed to a semiconductor integrated circuit in which the update period of a DLL is optimized/appropriately adjusted regardless of a PVT variation and a method for driving the same.

In accordance with an embodiment of the present invention, a semiconductor integrated circuit includes: a delay locked loop (DLL) configured to generate a DLL clock signal by delaying a source clock signal by a first delay time for obtaining a lock, wherein an update period of the DLL is controlled in response to an update period control signal after locking is completed; and an update period controller configured to generate the update period control signal based on a second delay time occurring in a loop path of the DLL in response to the source clock signal and a plurality of control signals provided from the DLL.

In accordance with another embodiment of the present invention, there is provided a method for driving a semiconductor integrated circuit which includes a DLL configured to generate a DLL clock signal by delaying a source clock by a first delay time for obtaining a lock and an update period controller configured to control an update period of the DLL. The method includes: generating, by the DLL, the DLL clock signal by delaying a source clock signal by the first delay time, wherein the first delay time is variably controlled; controlling, by the update period controller, the update period based on a second delay time that occurs in a loop path of the DLL in a state in which the generating of the DLL clock signal is completed; and performing, by the DLL, an update in response to the controlled update period.

DETAILED DESCRIPTION

Figure 1:
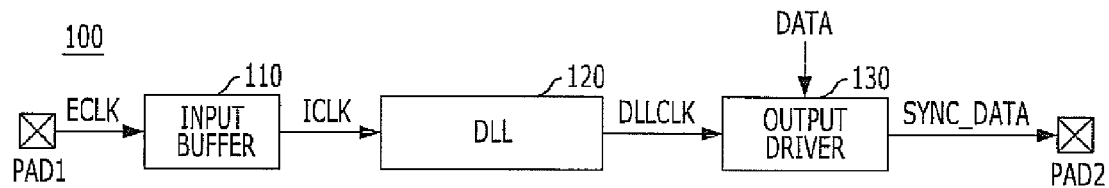
FIG. 1 is a block configuration diagram of a conventional semiconductor integrated circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
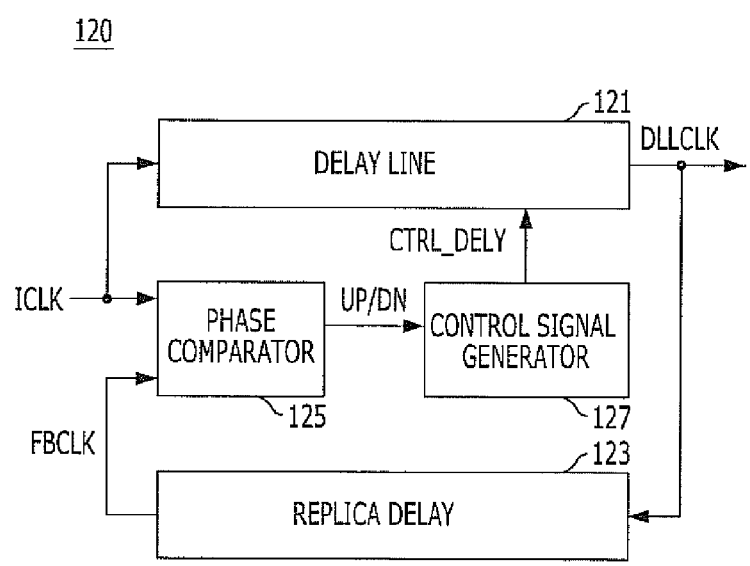
FIG. 2 is an internal configuration diagram of a DLL illustrated in FIG. 1.
Figure 3:
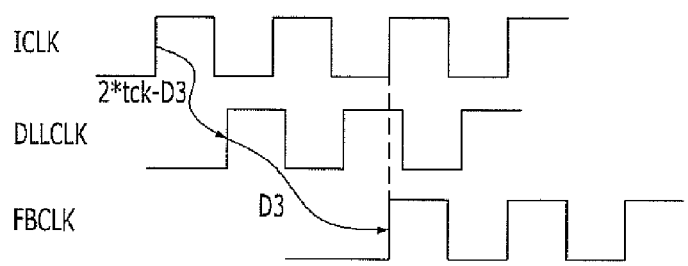
FIG. 3 is a timing diagram showing a state in which the DLL illustrated in FIG. 3 is locked.

In the embodiments of the present invention, like names are used for the same signals as those of the conventional semiconductor integrated circuit illustrated in FIGS. 1 to 3, for convenience of explanation.

Figure 4:
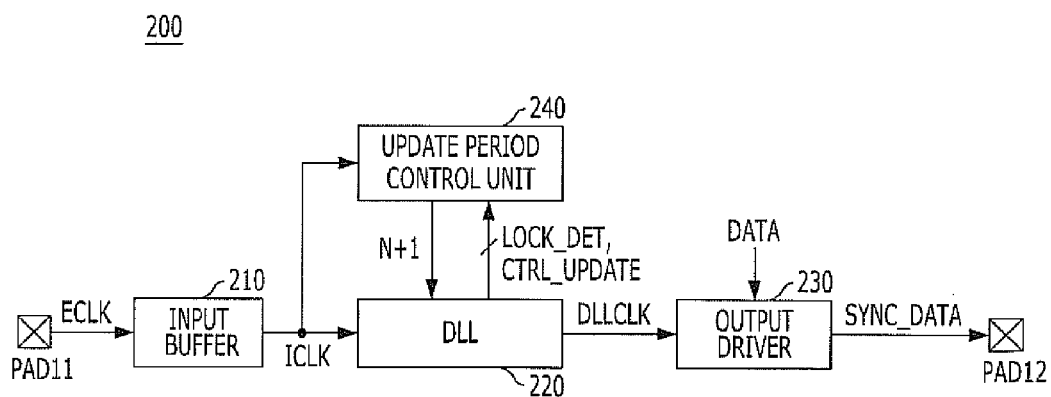
FIG. 4 is a block configuration diagram of a semiconductor integrated circuit in accordance with an embodiment of the present invention.
Figure 5:
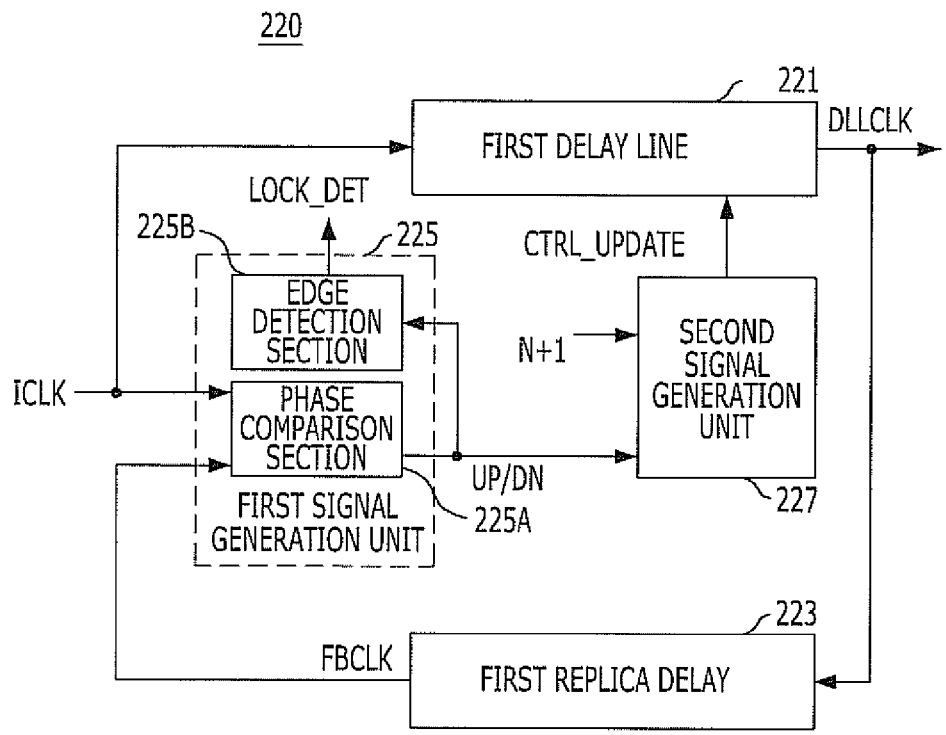
FIG. 5 is an internal configuration diagram of a DLL illustrated in FIG. 4.
Figure 6:
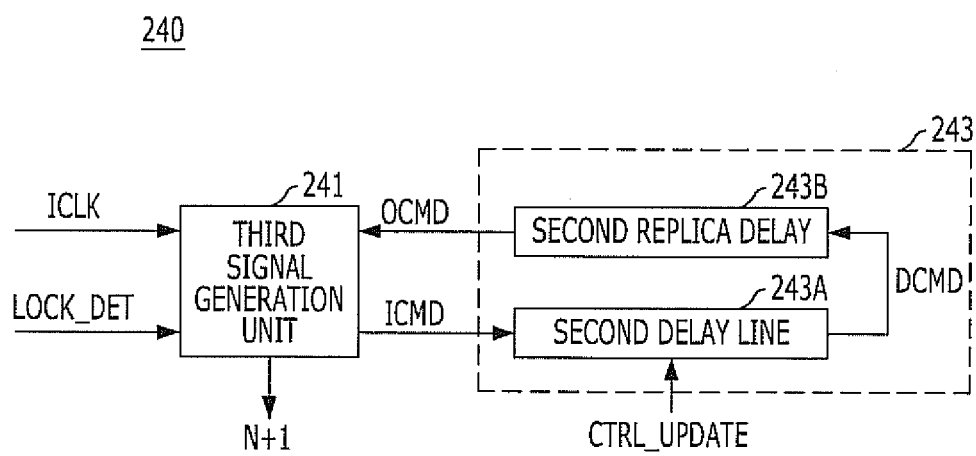
FIG. 6 is an internal configuration diagram of an update period controller illustrated in FIG. 4.
Figure 7:
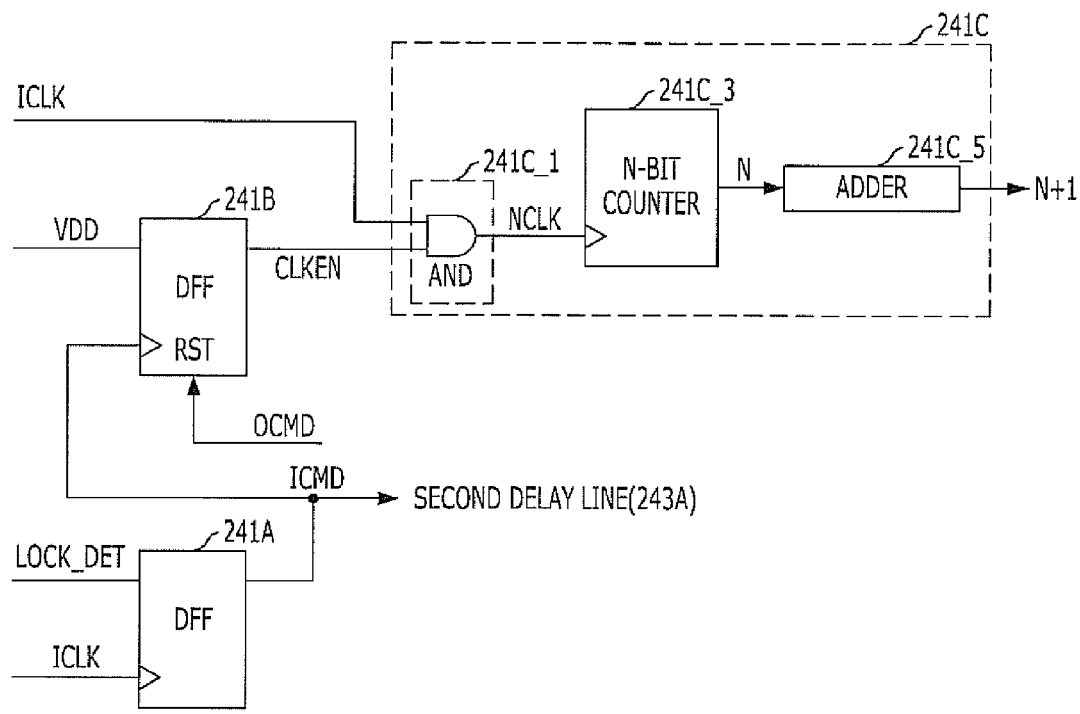
FIG. 7 is an internal configuration diagram of a third signal generation unit illustrated in FIG. 6.

FIG. 4 is a block configuration diagram of a semiconductor integrated circuit in accordance with an embodiment of the present invention. FIG. 5 is an internal configuration diagram of a DLL 220 illustrated in FIG. 4. FIG. 6 is an internal configuration diagram of an update period controller 240 illustrated in FIG. 4. FIG. 7 is an internal configuration diagram of a third signal generation unit 241 illustrated in FIG. 6.

Referring to FIG. 4, the semiconductor integrated circuit 200 includes an input buffer 210, a DLL 220, an output driver 230, and an update period controller 240 (that is, update period control unit). The input buffer 210 is configured to generate an internal clock signal ICLK corresponding to an external clock signal ECLK inputted through a first pad PAD11. The DLL 220 is configured to generate a DLL clock signal DLLCLK by delaying the internal clock signal ICLK by a delay time for obtaining a lock (hereinafter, referred to as 'a first delay time') and has an update period that is controlled in response to an update period control signal N+1 after locking is completed. The output driver 230 is configured to output data SYNC_DATA synchronized with the DLL clock signal DLLCLK to a second pad PAD12. The update period controller 240 is configured to generate the update period control signal N+1 based on a delay time (hereinafter, referred to as 'a second delay time') occurring in a loop path of the DLL 220 in response to the internal clock signal ICLK and a locking completion signal LOCK_DET and a delay control signal CTRL_UPDATE, which are provided from the DLL 220. The loop path of the DLL 220 includes a first delay line 221, a first replica delay 223, a phase comparison section 225A, and a second signal generation unit 227, which will be described below.

Referring to FIG. 5, the DLL 220 includes the first delay line 221, the first replica delay 223, a first signal generation unit 225, and a second signal generation unit 227. The first delay line 221 is configured to delay the internal output signal ICLK by the first delay time in response to the delay control signal CTRL_UPDATE and output the DLL clock signal DLLCLK. The first replica delay 223 is configured to delay the DLL clock signal DLLCLK by a delay time (hereinafter, referred to as 'a third delay time D3') equal to an actual delay through a clock path and data path and output a feedback clock signal FBCLK. The first signal generation unit 225 is configured to generate a clock phase comparison signal UP/DN and the locking completion signal LOCK_DET in response to the internal clock signal ICLK and the feedback clock signal FBCLK. The second signal generation unit 227 is configured to generate the delay control signal CTRL_UPDATE in response to the clock phase comparison signal UP/DN and the update period control signal N+1. Here, the third delay time is referred to as a replica delay time D3, which is the sum of a delay time D1 equal to an actual delay through a path until the internal clock signal ICLK is generated from the first pad PAD11 receiving the external clock signal ECLK and a delay time D2 equal to an actual delay through a path until the data SYNC_DATA synchronized with the DLL clock signal DLLCLK is outputted to the second pad PAD12 (D3=D1+D2).

Meanwhile, the first signal generation unit 225 includes a phase comparison section 225A and an edge detection section 225B. The phase comparison section 225A is configured to compare phases of the internal clock signal ICLK with the feedback clock signal FBCLK and output the clock phase comparison signal UP/DN. The edge detection section 225B is configured to output the locking completion signal LOCK_DET in response to the clock phase comparison signal UP/DN. Hereinafter, a loop until the result of the second signal generation unit 227 based on the output of the first delay line 221 is again applied to the first delay line 221 is referred to the loop path. More specifically, the loop path includes the first delay line 221, the first replica delay 223, the phase comparison section 225A, and the second signal generation unit 227.

The second signal generation unit 227 may include a digital filter for determining whether the clock phase comparison signal UP/DN is proper or not. In this case, the second signal generation unit 227 samples the clock phase comparison signal UP/DN based on a filter depth which is controlled according to the update period control signal N+1 and generates the delay control signal CTRL_UPDATE in response to the sampling result.

Referring to FIG. 6, the update period controller 240 includes a third signal generation unit 241 and a fourth signal generation unit 243. The third signal generation unit 241 is configured to generate a synchronized locking completion signal ICMD and the update period control signal N+1 in response to the internal clock signal ICLK, the locking completion signal LOCK_DET, and a delayed locking completion signal OCMD. The fourth signal generation unit 243 is configured to delay the synchronized locking completion signal ICMD by a part of the second delay time and generate the delayed locking completion signal OCMD.

According to an example, the fourth signal generation unit 243 includes a second delay line 243A and a second replica delay 243B. The second delay line 243A is configured to delay the synchronized locking completion signal ICMD by the first delay time in response to the delay control signal CTRL_UPDATE. The second replica delay 243B is configured to delay an output signal DCMD of the second delay line 243A by the third delay time and output the delayed locking completion signal OCMD. At this time, the second delay line 243A and the second replica delay 243B correspond to the first delay line 221 and the first replica delay 223 in the loop path of the DLL 220, respectively.

Referring to FIG. 7, the third signal generation unit 241 includes a synchronization section 241A, an enable signal generation section 241B, and an output section 241C. The synchronization section 241A is configured to synchronize the locking completion signal LOCK_DET with the internal clock signal ICLK and output the synchronized locking completion signal ICMD. The enable signal generation section 241B is configured to generate an enable signal CLKEN in response to the synchronized locking completion signal ICMD and the delayed locking completion signal OCMD. The output section 241C is configured to output the update period control signal N+1 in response to the enable signal CLKEN and the internal clock signal ICLK.

The synchronization section 241A outputs the locking completion signal LOCK_DET as the synchronized locking completion signal ICMD according to a clock edge of the internal clock signal ICLK, and the enable signal generation section 241B generates the enable signal CLKEN that is activated according to the synchronized locking completion signal ICMD and deactivated according to the delayed locking completion signal OCMD. The synchronization section 241A may include a D flip-flop.

The output section 241C includes an output limiter 241C_1, a counter 241C_3, and an adder 241C_5. The output limiter 241C_1 is configured to output the internal clock signal ICLK as a limited internal clock during a period where the enable signal CLKEN is activated. The counter 241C_3 is configured to count the toggling number of the limited internal clock signal NCLK outputted from the output limiter 241C_1. The adder 241C_5 is configured to add a value of 1 to a counted value N outputted from the counter 241C_3 and output the update period control signal N+1. Here, the output limiter 241C_1 may include an AND gate AND configured to perform an AND operation on the enable signal CLKEN and the internal clock signal ICLK.

Hereinafter, a method for driving the semiconductor integrated circuit 200 in accordance with the embodiment of the present invention will be described.

The method for driving the semiconductor integrated circuit 200 includes a tracking step in which the DLL 220 generates a DLL clock signal by delaying a source clock signal by the first delay time which is variably controlled, an update period control step in which the update period controller 240 controls an update period based on the second delay time occurring in the loop path of the DLL 220 in a state in which the tracking step was completed, and an update step in which the DLL 220 performs an update in response to the controlled update period.

Figure 8:
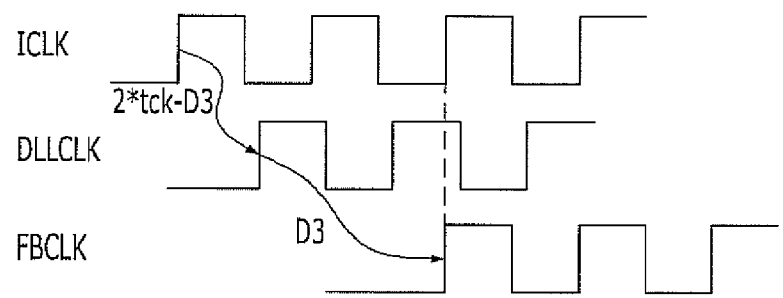
FIGS. 8 and 9 are timing diagrams illustrating a method for driving a semiconductor integrated circuit in accordance with the embodiment of the present invention.
Figure 9:
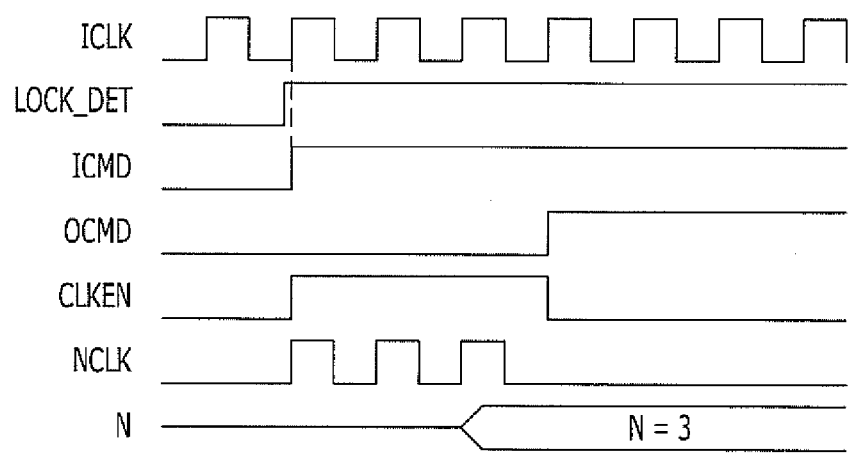

FIG. 8 is a timing diagram illustrating the tracking step of the DLL 220. FIG. 9 is a timing diagram illustrating the update period control step of the update period control unit 240, after the tracking step of the DLL 220 is completed.

Referring to FIG. 8, when the external clock signal ECLK is buffered through the input buffer unit 210 during initial driving and transmitted as the internal clock signal ICLK to the first delay line 221, the first delay line 221 bypasses the internal clock signal ICLK.

Subsequently, the first replica delay 223 delays the DLL clock signal DLLCLK outputted from the first delay line 221 by the modeled third delay time D3 and outputs the delayed DLL clock signal DLLCLK to the phase comparator 125. Here, the modeled third delay time D3 is a delay time equal to an actual delay through the clock path and data path. The third delay time D3 is defined as the sum of a delay time equal to an actual delay through the path until the internal clock ICLK is generated in response to receiving the external clock signal ECLK from the first pad PAD11 and a delay time equal to an actual delay through the path until the synchronized data SYNC_DATA is outputted from the second pad PAD12 in synchronization with the DLL clock signal DLLCLK.

The phase comparison section 225A compares the phase of the internal clock signal ICLK outputted from the input buffer unit 210 with that of the feedback clock signal FBCLK outputted from the first replica delay 223. The second signal generation unit 227 generates the delay control signal CTRL_UPDATE in response to the clock phase comparison signal UP/DN outputted from the phase comparison section 225A and outputs the generated delay control signal CTRL_UPDATE to the first delay line 221.

Accordingly, the first delay line 121 delays the internal clock signal ICLK by a desired delay time in response to the delay control signal CTRL_UPDATE and outputs the DLL clock signal DLLCLK.

When the above-described series of operations are repeated and the phases of the internal clock signal ICLK and the feedback clock signal FBCLK are synchronized in response to the comparison result of the phase comparison section 225A, the first delay time of the first delay line 221 is locked. Referring to FIG. 8, it can be seen that the internal clock signal ICLK and the feedback clock signal FBCLK are synchronized with each other. At this time, the DLL clock signal DLLCLK is delayed by the first delay time (2*tCK−D3) for obtaining a lock in comparison to the internal clock signal ICLK.

Referring to FIG. 9, after the first delay time (2*tCK−D3) for obtaining a lock the first delay line 221 is decided, that is, when the tracking step is completed, the locking completion signal LOCK_DET is activated to a logic high level. More specifically, the edge detection section 225B detects a time point at which the clock phase comparison signal UP/DN outputted from the phase comparison section 225A transits to a desired logic level and activates the locking completion signal LOCK_DET based on the detected time point.

When the synchronized locking completion signal ICMD is activated by the synchronization section 241A according to the clock edge of the internal clock signal ICLK as the locking completion signal LOCK_DET is activated, the delayed locking completion signal OCMD is activated by the fourth signal generation unit 243 after a desired time. At this time, the desired time includes the first delay time by the second delay line 243A and the third delay time by the second replica delay 243B. According to an example, the delay times of the first delay line 221 and the second delay line 243A are controlled by the delay control signal CTRL_UPDATE outputted from the second signal generation unit 227. As the first delay line 221 is locked at the first delay time (2*tCK−D3), the second delay line 243A is also locked at the first delay time (2*tCK−D3).

Meanwhile, the enable signal generation section 241B activates the enable signal CLKEN to a logic high level in response to the activation time point of the synchronized locking completion signal ICMD and deactivates the enable signal CLKEN to a logic low level in response to the activation time point of the delayed locking completion signal OCMD.

Subsequently, the output limiter 241C_1 transmits the internal clock signal ICKL to the counter 241C_3, for example, only during a period where the enable signal CLKEN is activated, and the counter 241C_3 counts the toggle number of the internal clock signal ICKL (for example, three) and transmits the counted value (N=3) to the adder 241C_5. The adder 241C_5 adds a value of 1 corresponding to one period (1 tCK) of the internal clock signal ICKL to the counted value (N=3) transmitted from the counter 241C_3 and outputs the counted value to the second signal generation unit 227. When the value of 1 is added by the counter 241C_5, the time during which the delay time set in the first delay line 221 is updated. The time includes the operation time of the phase comparison section 225A and the second signal generation unit 227.

Accordingly, the second signal generation unit 227 outputs the delay control signal CTRL_UPDATE in response to the update period which is controlled according to the update period control signal N+1 applied from the update period controller 240. For example, when the filter depth of the second signal generation unit 227 is controlled to equal '5 tCK' according to the update period control signal N+1, the second signal generation unit 227 samples the clock phase comparison signal UP/DN. As the result of the sampling, when the logic state of the clock phase comparison signal UP/DN indicates a period equal to or more than 5 tCK, the second signal generation unit 227 activates the delay control signal DELY_UPDATE. Here, 'tCK' represents the period of the clock signal. On the other hand, when the filter depth of the second signal generation unit 227 is controlled to '3 tCK' according to the update period control signal N+1, the second signal generation unit 227 samples the clock phase comparison signal UP/DN. As the result of the sampling, when the logic state of the clock phase comparison signal UP/DN indicates a period equal to or more than '3 tCK', the second signal generation unit 227 activates the delay control signal DELY_UPDATE.

In accordance with the embodiment of the present invention, the delay time occurring in the loop path of the DLL 220 is monitored to control the update period. Accordingly, as the tracking speed is optimized regardless of the PVT characteristic or the operation frequency, the operation performance of the semiconductor integrated circuit may be improved.

While the present invention has been described with respect to the specific embodiments, it will be apparent to those skilled in the art that various changes and modifications may be made without departing from the spirit and scope of the invention as defined in the following claims.

For example, it has been described in the embodiment of the present invention that the fourth signal generation unit 243 includes only components corresponding to the first delay line 221 and the first replica delay line 223 to delay the synchronized locking completion signal ICMD by a part of the second delay time. Without being limited thereto, however, the fourth signal generation unit 243 may include components corresponding to the first delay line 221, the first replica delay 223, the phase comparison section 225A, and the second signal generation unit 227 to delay the synchronized locking completion signal ICMD by the second delay time. In this case, the adder 241C_5 included in the third signal generation unit 241 may be omitted.

Furthermore, while it has been described in the embodiment of the present invention that the adder 241C_5 adds a value corresponding to one period 1 tCK of the clock signal, the adder 241C_5 may add a value corresponding to two periods (2 tCK) or more according to an operation frequency.

What is claimed is:

1. A semiconductor integrated circuit comprising:
   a delay locked loop (DLL) configured to generate a DLL clock signal by delaying a source clock signal by a first delay time for obtaining a lock, wherein an update period of the DLL is controlled in response to an update period control signal after locking is completed; and
   an update period controller configured to generate the update period control signal based on a second delay time occurring in a loop path of the DLL in response to the source clock signal and a plurality of control signals provided from the DLL.

2. The semiconductor integrated circuit of claim 1, wherein the DLL comprises:
   a first delay line configured to delay the source clock signal by the first delay line in response to a delay control signal and output the DLL clock signal;
   a first replica delay configured to delay the DLL clock signal by a third delay time equal to a delay through a clock path and output a feedback clock signal;
   a first signal generation unit configured to generate a clock phase comparison signal and a locking completion signal in response to the source clock signal and the feedback clock signal; and
   a second signal generation unit configured to generate the delay control signal in response to the clock phase comparison signal and the update period control signal.

3. The semiconductor integrated circuit of claim 2, wherein the plurality of control signals comprise the delay control signal and the locking completion signal.

4. The semiconductor integrated circuit of claim 2, wherein the second delay time comprises the first delay time and the third delay time.

5. The semiconductor integrated circuit of claim 2, wherein the first signal generation unit comprises:
- a phase comparison section configured to compare phases of the source clock signal and the feedback clock signal and output the clock phase comparison signal based on the phrase comparison; and
- an edge detection section configured to output the locking completion signal in response to the clock phase comparison signal.

6. The semiconductor integrated circuit of claim 2, wherein the second signal generation unit comprises a filter configured to filter the clock phase comparison signal.

7. The semiconductor integrated circuit of claim 4, wherein the update period controller comprises:
- a third signal generation unit configured to generate a synchronized locking completion signal and the update period control signal in response to the source clock signal, the locking completion signal, and a delayed locking completion signal; and
- a fourth signal generation unit configured to delay the synchronized locking completion signal by the second delay time or a part of the second delay time and generate the delayed locking completion signal.

8. The semiconductor integrated circuit of claim 7, wherein the fourth signal generation unit comprises:
- a second delay line configured to delay the synchronized locking completion signal by the first delay time; and
- a second replica delay configured to delay an output signal of the second delay line by the third delay time and output the delayed locking completion signal.

9. The semiconductor integrated circuit of claim 7, wherein the third signal generation unit comprises:
- a synchronization section configured to synchronize the locking completion signal with the source clock signal and output the synchronized locking completion signal;
- an enable signal generation section configured to generate an enable signal in response to the synchronized locking completion signal and the delayed locking completion signal; and
- an output section configured to output the update period control signal in response to the enable signal and the source clock signal.

10. The semiconductor integrated circuit of claim 9, wherein the synchronization section and the enable signal generation section comprise a D flip-flop.

11. The semiconductor integrated circuit of claim 9, wherein the output section comprises:
- an output limiter configured to output the source clock signal during a period that the enable signal is activated; and
- a counter configured to count the source clock signal outputted from the output limiter.

12. The semiconductor integrated circuit of claim 11, wherein the output section further comprises an adder configured to add a first value to a counted value outputted from a counter and output the update period control signal.

13. The semiconductor integrated circuit of claim 11, wherein the output limiter comprises an AND gate configured to perform an AND operation on the enable signal and the source clock signal.

14. The semiconductor integrated circuit of claim 2, further comprising:
- an input buffer configured to buffer an external clock signal and generate the source clock signal; and
- an output driver configured to output data in synchronization with the DLL clock signal.

15. The semiconductor integrated circuit of claim 14, wherein the third delay time comprises a delay time equal to a delay through a clock input path including the input buffer and a delay time equal to a delay through a clock output path including the output driver.

16. A method for driving a semiconductor integrated circuit which includes a DLL configured to generate a DLL clock signal by delaying a source clock by a first delay time for obtaining a lock and an update period controller configured to control an update period of the DLL, the method comprising:
- generating, by the DLL, the DLL clock signal by delaying a source clock signal by the first delay time, wherein the first delay time is variably controlled;
- controlling, by the update period controller, the update period based on a second delay time that occurs in a loop path of the DLL in a state in which the generating of the DLL dock signal is completed; and
- performing, by the DLL, an update in response to the controlled update period.

17. The method of claim 16, wherein the second delay time comprises the first delay time and a third delay time equal to a delay through a clock path.

18. The method of claim 16, wherein the controlling of the update period comprises:
- activating, by the DLL, a locking completion signal as the generating of the DLL clock signal is completed;
- counting, by the update period controller, the source clock signal during the second delay time and outputting the counted value, as the locking completion signal is activated; and
- performing, by the DLL, an update in response to the update period controlled according to the counted value.

19. The method of claim 18, wherein the outputting of the counted value comprises:
- synchronizing the locking completion signal with the source clock signal and generating the synchronized locking completion signal;
- generating a delayed locking completion signal by delaying the synchronized locking completion signal by the second delay time and generating an enable signal having an activation period in response to the synchronized locking completion signal and the delayed locking completion signal; and
- counting the toggling number of the source clock signal during the activation period of the enable signal.

20. The method of claim 18, wherein the outputting of the counted value comprises:
- adding a first value to the counted value.

* * * * *